(12) United States Patent
Maamari et al.

(10) Patent No.: US 7,191,374 B2
(45) Date of Patent: Mar. 13, 2007

(54) METHOD OF AND PROGRAM PRODUCT FOR PERFORMING GATE-LEVEL DIAGNOSIS OF FAILING VECTORS

(75) Inventors: Fadi Maamari, San Jose, CA (US); Sonny Ngai San Shum, San Jose, CA (US); Benoit Nadeau-Dostie, Aylmer (CA)

(73) Assignee: LogicVision, Inc., San Jose, CA (US)

( * ) Notice: Subject to any disclaimer, the term of this patent is extended or adjusted under 35 U.S.C. 154(b) by 634 days.

(21) Appl. No.: 10/435,094

(22) Filed: May 12, 2003

(65) Prior Publication Data

US 2003/0217315 A1    Nov. 20, 2003

Related U.S. Application Data

(60) Provisional application No. 60/379,732, filed on May 14, 2002.

(51) Int. Cl.
*G01R 31/28* (2006.01)
*G06F 17/50* (2006.01)

(52) U.S. Cl. .......................... 714/738; 716/4
(58) Field of Classification Search ........... 714/724, 714/738, 741; 716/4
See application file for complete search history.

(56) References Cited

U.S. PATENT DOCUMENTS

| | | | |
|---|---|---|---|
| 5,043,987 A | 8/1991 | Stark et al. | 714/737 |
| 5,127,005 A * | 6/1992 | Oda et al. | 714/26 |
| 5,189,365 A | 2/1993 | Ikeda et al. | 714/33 |
| 5,515,384 A | 5/1996 | Horton, III | 714/732 |
| 5,548,715 A | 8/1996 | Maloney et al. | 714/28 |
| 5,566,187 A | 10/1996 | Abramovici et al. | 714/724 |
| 5,790,565 A | 8/1998 | Sakaguchi | 714/738 |
| 5,808,919 A | 9/1998 | Preist et al. | 702/183 |
| 5,831,992 A * | 11/1998 | Wu | 714/732 |
| 6,134,689 A | 10/2000 | Mateja et al. | 714/736 |
| 6,185,707 B1 * | 2/2001 | Smith et al. | 714/724 |
| 6,202,181 B1 | 3/2001 | Ferguson et al. | 714/724 |
| 6,308,293 B1 | 10/2001 | Shimono | 714/741 |
| 6,324,665 B1 | 11/2001 | Fay | 714/736 |

(Continued)

OTHER PUBLICATIONS

Song et al., Diagnostic Techniques for the IBM 600 MHz G5 Micriprocessor, 1999 International Test Conference Proceedings, p. 1073-1082.

(Continued)

*Primary Examiner*—Guy Lamarre
*Assistant Examiner*—Cynthia Britt
(74) *Attorney, Agent, or Firm*—Eugene E. Prouix

(57) ABSTRACT

A method of fault diagnosis of integrated circuits having failing test vectors with observed fault effects using fault candidate fault-effects obtained by simulation of a set of test vectors, comprises determining a fault candidate diagnostic measure for each fault candidate, the fault candidate diagnostic measure having a fault candidate match metric, an observed fault effect mismatch metric and a fault candidate excitation metric, ranking fault candidates in decreasing diagnostic measure order; and identifying fault candidate(s) having the highest diagnostic measure as the most likely cause of observed fault effects.

35 Claims, 4 Drawing Sheets

U.S. PATENT DOCUMENTS

| | | | |
|---|---|---|---|
| 6,490,702 B1 | 12/2002 | Song et al. | 714/726 |
| 6,516,432 B1 | 2/2003 | Motika et al. | |
| 6,516,433 B1 | 2/2003 | Koenig | 714/737 |
| 6,532,440 B1 | 3/2003 | Boppana et al. | 703/14 |
| 6,536,007 B1 | 3/2003 | Venkataraman | 714/724 |
| 6,560,736 B2 | 5/2003 | Ferguson et al. | 714/724 |
| 6,567,946 B1 * | 5/2003 | Nozuyama | 714/741 |

OTHER PUBLICATIONS

De et al., "Failure Analysis for Full-Scan Circuits", 1995 International Test Conference Proceedings, Oct. 21-25, 1995, p. 636-645.

Waicukauski, "Diagnosis of BIST Failures by PPSFP Simulation", 1987 International Test Conference Proceedings, p. 480-484.

* cited by examiner

```
{ File generated by the ETA tool }
DESIGN_NAME circuitA ;
MODE logicBist ;
LVDB /myChip/circuitA.lvdb ;
START_VECTOR 1 ;
END_VECTOR 32000 ;

CDF_INFO ;
END CDF_INFO ;

FAULT_SET ;
V5
5
1c
V8
7
a
V11
3
END FAULT_SET ;
```

Fig. 3.

```
###############################################
Diagnostic Summary ##
###############################################
File created by : gateDiagnose
Version : 4.0c Build xxxxx
Created on : 10/20/02 13:06:41
Module : LVBIST1A;
Mode : logicbist;
LVDB : demo_chip_eate;
Failure Log File : LVBIST1A_BP0_example.flog;

Ordered Candidate Fault List By Diagnostic Measure:
===================================================
100.0% coreInstance.UNITA1_COUNTER.n61 sa1
= coreInstance.\CNT_MINUS_ONE[0] sa0
83.3% coreInstance.n594 sa0
67.2% coreInstance.\CNT_reg[0] .DD sa0

Ordered Candidate Fault List By Match Ratio:
===================================================
100.0% coreInstance.UNITA1_COUNTER.n61 sa1
= coreInstance.\CNT_MINUS_ONE[0] sa0
100.0% coreInstance.n594 sa0

Ordered Candidate Fault List By Mismatch Ratio:
===================================================
0.0% coreInstance.UNITA1_COUNTER.n61 sa1
= coreInstance.\CNT_MINUS_ONE[0] sa0
0.0% coreInstance.n594 sa0

Ordered Candidate Fault List By Excitation Ratio:
===================================================
100.0% coreInstance.UNITA1_COUNTER.n61 sa1
= coreInstance.\CNT_MINUS_ONE[0] sa0

50.0% coreInstance.n594 sa0
```

Fig. 4.

METHOD OF AND PROGRAM PRODUCT FOR PERFORMING GATE-LEVEL DIAGNOSIS OF FAILING VECTORS

CROSS-REFERENCE TO RELATED APPLICATIONS

This application claims the benefit of U.S. Provisional Patent Application Ser. No. 60/379,732 filed May 14, 2002.

BACKGROUND OF THE INVENTION

1. Field of the Invention

The present invention generally relates to testing of integrated circuits and, more specifically, to the diagnosis of detected faults in integrated circuits.

2. Description of Related Art

Testing of integrated circuits is well known in the art. When a manufactured chip fails testing, it is often desirable to diagnose the source of the failure. The need to diagnose such failures is driven by design debug and/or yield improvement. In a typical design debug scenario, almost every chip fails testing. Diagnosis is needed to identify the source of a failure, which is often either a design error or an oversight which results in a timing error, or a database that has not been updated after an engineering change order (ECO). The chip is not yet in volume production, and tester time or server time required for diagnosis are not critical.

Yield improvement relates to a chip which is in production. A subset of manufactured chips fail testing, resulting in reduced yield. In a high volume chip, a lower yield has a significant impact on cost. Identifying failure sources may enable changes to a design that will reduce the frequency of these failures, thereby increasing yield and reducing the cost of manufacturing good devices.

In both cases, the diagnostic data needed from the tester is identical: failing vectors need to be identified, and, for each failing vector, failing flops need to be identified. Once data has been gathered, it can then be analyzed to diagnose failures down to a gate, to help debug the design or improve yield. In both design debug and yield improvement modes, the analysis can be done off-line. Narrowing the diagnosis from failing flops down to a failing gate presents several challenges.

Diagnosis requires comparing observed failing output to simulated failures of modeled faults. Since actual defects do not always correspond to a modeled fault, a perfect match cannot always be found between observed failures and simulated faulty behavior. Fault simulation usually uses a single fault model, i.e., it assumes at most one fault is present in the circuit at a time. In practice, a failing device may have more than one defect. As a result, it is difficult to match single fault simulations to observed failing data.

In the past, sign-off of a chip with gate-level diagnosis capability required the building of a fault dictionary. Diagnosis would consist of searching the fault dictionary for a match with the observed failing data. It is now well established that such an approach is no longer viable, as the size of the dictionary is prohibitive for chips now designed and manufactured. Instead, it is preferred to perform diagnosis dynamically using observed failing data as input to diagnostic fault simulation.

A Song et al. paper entitled "Diagnostic for the IBM S/390 600 MHz G5 Microprocessor", published in the 1999 ITC Proceedings describes a software based diagnostic technique which involves applying test patterns to a circuit using a tester and identifying latches/pins that fail. After identifying fault candidates, each fault is simulated by injecting the fault into a simulator. The tester results and simulation results are used to determine a diagnostic score for each fault candidate. The score is a composite of the number of outputs which failed on a tester but passed in simulation, the number of outputs which failed both in the tester and in simulation, and the number of outputs which passed on the tester but failed in simulation.

De and Gunda in a paper entitled "Failure Analysis for Full-Scan Circuits, 1995 ITC Proceedings, p. 636–645, propose a method which employs a metric based on match/mismatch ratios. The proposal ignores outputs where there is a discrepancy between an observed fault effect and a fault candidate fault-effect and propose coefficients to weigh the match and mismatch. The authors admit that the method does not work well when a defect is not a "stuck-at" defect. The patentee asserts that a unique signature for each fault is desirable. The proposed method requires modification of Automatic test pattern generation (ATPG) methods to accommodate the method. Another drawback of the method is that it requires layout information, which may not always be available, and explicit analysis of the shorts.

Ferguson et al. U.S. Pat. No. 6,202,181 granted on Mar. 13, 2001 for "Method for Diagnosing Bridging Faults in Integrated Circuits" proposes a method for diagnosing bridging faults using stuck-at signatures. The method considers as candidates only those faults which are determined to be realistic through an inductive fault analysis. The method imposes match restrictions and match requirements during matching in order to minimize diagnosis size. Match ranking is applied and the matching criteria relaxed to increase the effective precision and to increase the number of correct diagnoses. The method reduces the number of bridging fault candidates by constructing a dictionary of composite signatures of node pairs based on a ranking threshold.

Shimono U.S. Pat. No. 6,308,293 granted on Oct. 23, 2001 for "Fault Diagnosis Apparatus and Recording Medium with a Fault Diagnosis Program Recorded Thereon" provides a fault diagnosis apparatus which estimates a disconnection fault site intermediate of a branch wiring line in an LSI based on a result of an LSI test performed by using a test pattern. An indefinite value simulation narrowing down section uses a test pattern to perform, for each gate included in a suspected fault gate set, a simulation in which the output value of the gate is set to an indefinite value, and removes any gate from which a definite value is outputted among those outputs which have been determined to be errors with error test patterns. An output value check narrowing down section removes any gate from a suspected fault gate set if the gate satisfies a condition that the output value thereof at least in one error test pattern is different from that in the other error test patterns. A branch destination fault simulation narrowing down section defines 0/1 stuck-at faults to output branch designations of each gate included in the suspected fault gate set and performs a logic simulation using the test pattern. The branch destination fault simulation narrowing down section removes any gate from the suspected fault gate set if the gate does not have an output branch destination fault which is not detected at a normal output but is detected at an error output. The patent discloses a well known method of generating an initial fault candidate list is by simply considering the fanin of outputs with at least one observed fault effect.

SUMMARY OF THE INVENTION

The present invention seeks to provide a simple and effective circuit diagnostic method which does not require circuit layout information and which can be used to diagnose faults other that stuck-at faults using stuck-at based simulation tools.

The present invention is generally defined as a method of fault diagnosis of an integrated circuit having failing test vectors with observed fault effects using fault candidate fault-effects obtained by simulation of a set of test vectors, comprises determining a fault candidate diagnostic measure for each fault candidate, the fault candidate diagnostic measure having a fault candidate match metric, an observed fault effect mismatch metric and a fault candidate excitation metric, ranking fault candidates in decreasing diagnostic measure order; and identifying fault candidate(s) having the highest diagnostic measure as the most likely cause of observed fault effects.

BRIEF DESCRIPTION OF THE DRAWINGS

These and other features of the invention will become more apparent from the following description in which reference is made to the appended drawings in which:

FIG. 3 illustrates a log file containing diagnostic parameters specified by a user and produced by a diagnostic software tool according to an embodiment of the present invention; and FIG. 4 illustrates a diagnostic summary output by a diagnostic software tool according to an embodiment of the present invention.

DETAILED DESCRIPTION OF EMBODIMENTS OF THE INVENTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

In general, the present invention provides a method of fault diagnosis of integrated circuits having failing test vectors with observed fault effects using fault candidate fault-effects obtained by simulation of a set of test vectors. The method comprises determining a fault candidate diagnostic measure for each fault candidate, with the fault candidate diagnostic measure having a fault candidate match metric, an observed fault effect mismatch metric and a fault candidate excitation metric, ranking fault candidates in decreasing diagnostic measure order; and identifying fault candidate(s) having the highest diagnostic measure as the most likely cause of observed fault effects.

Determining a fault candidate diagnostic measure comprises, for each fault candidate, determining a match metric indicative of fault candidate fault-effects that match observed fault effects; determining a mismatch metric indicative of observed fault effects that do not match fault candidate fault-effects; and determining a fault candidate excitation metric indicative of the number failing vectors that have at least one fault candidate fault effect that matches an observed fault effect and of the number of vectors that have at least one fault candidate fault-effect.

Figure 1:
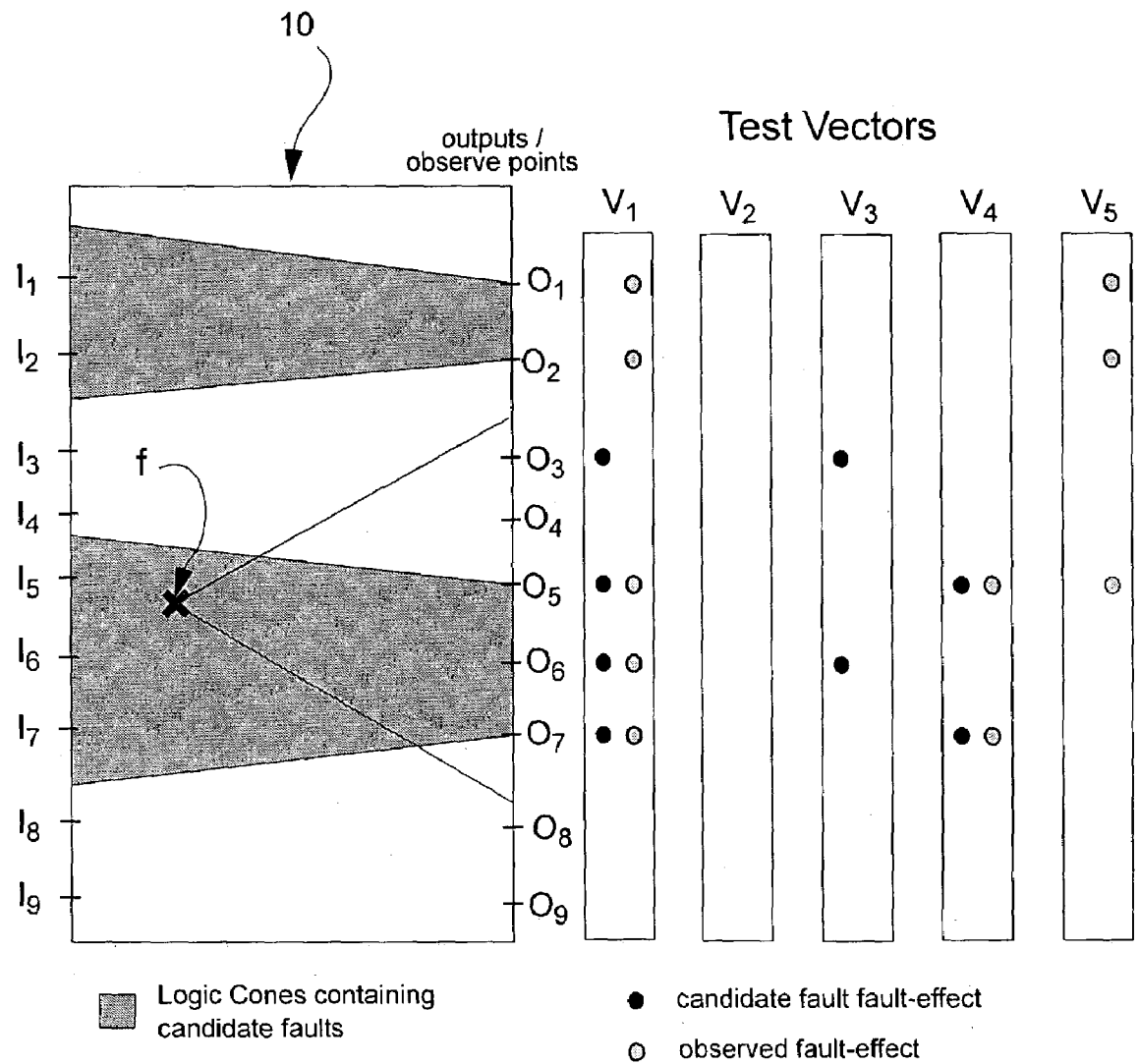
FIG. 1 is a diagrammatic view of a circuit having a fault, fault-effects associated with the fault and observed fault-effects in five vectors which were applied to the circuit.

The method will be better understood by referring to FIG. 1, which is a diagrammatic view of a circuit 10 having inputs 11–19, to which test vectors are applied, and outputs O1–O9, from which circuit test responses are obtained. For purposes of illustration the circuit is shown with one fault candidate, f. The figure shows five rectangles which represent a set of five test vectors, labeled $V_1$–$V_5$, which were applied to the circuit. Grey or light circles within the rectangles represent "observed fault-effects" at corresponding circuit outputs and determined by comparing the response of the circuit to the vectors. The black circles in the vector rectangles represent fault-effects resulting from a fault candidate f.

The above mentioned metrics will now be described in more detail.

Fault Candidate Match Metric

The fault candidate fault-effect match metric is preferably in the form of a percentage of fault effects of the fault candidate that match observed fault effects. The motivation for determining a fault candidate fault-effect match ratio is to help diagnose bridging defects and other un-modeled defects, which match well with a stuck-at fault at a defect site when excited, but are not excited in every vector for which the stuck-at fault is present.

The determination of the match metric involves, for each failing test vector, determining the number of fault candidate fault-effects and the number of fault candidate fault-effects that match observed faults effects. Vectors which do not have fault candidates fault-effects and/or observed fault effects are excluded from these counts. A cumulative fault candidate match metric for all vectors considered is calculated by dividing the sum of the number of fault candidate fault-effects that match observed faults effects by the sum of the number of fault candidate fault-effects. The resulting ratio is converted to a percentage.

From FIG. 1 and Table 1, it will be seen that for vector V1, three of the four fault effects of fault candidate f match observed fault effects from the failing chip 10. In Vectors V2 and V5, there are no fault effects for fault candidate f, and, therefore, the match ratio for V2 and V5 is not computed. For vector V3, fault candidate f has two fault effects, but there are no observed fault effects. Thus, the match ratio is 0. In such a case, the fault is considered not excited and the match ratio of 0 is not taken into account when the cumulative (average) match ratio for the fault is computed. The fact that a fault is not excited is reflected in the fault excitation metric, described below. For Vector V4, there is a perfect match-there are two fault candidate fault-effects and two observed fault effects.

Observed Fault Effect Mismatch Metric

The observed fault effect mismatch metric is preferably in the form of a percentage of observed fault-effects that do not match the fault candidate fault-effects.

The determination of the observed fault effect mismatch metric is performed by counting, in each vector of the set of test vectors, the number of observed fault-effects and the number of observed faults effects that do not match a fault candidate fault-effect. Vectors which do not have fault candidate fault-effects and/or observed fault effects are excluded from consideration. When all vectors have been considered, a cumulative mismatch metric is calculated. Specifically, the cumulative mismatch metric is the ration of the sum of the numbers of observed faults effects that do not match fault candidate fault-effects to the sum of the numbers of observed fault effects. Again, preferably, this metric is converted to a percentage.

In the example of FIG. 1, there are five observed fault effects in V1, of which, two do not match the fault effects of fault candidate f. This results in a mismatch ratio of 40%. Vectors V2 and V3 have no observed fault effects and, therefore, the mismatch metric is not calculated. Vector V4 has two observed fault effects that match two fault candidate fault-effects which results in a mismatch ratio of 0. Vector V5 has three observed fault effects and no fault candidate effects. Thus, the mismatch ratio is three out of three or 100%.

Fault Candidate Excitation Metric

The fault candidate excitation metric is a ratio of the number of vectors that have at least one fault candidate fault-effect that matches an observed fault effect divided by the number of vectors having at least one fault candidate fault-effect. This metric will indicate when a fault candidate is not excited. From FIG. 1, it will be seen that vectors V1 and V4 have at least one fault effect which results from fault candidate f that matches an observed fault effect. However, there are three vectors, V1, V3 and V4, that have fault candidate fault effects. Fault candidate f is not excited in vector V3 and, thus, for the set of five vectors, the fault excitation metric is 67%.

As shown in Table 1, each vector is evaluated individually and assigned a value of 1 if the above condition is met and, otherwise, assigned a value of 0. Vectors V1 and V4 meet the condition. Vector V3 does not. Vectors V2 and V5 have no fault candidate fault effects and, therefore, are excluded.

Fault Candidate Diagnostic Measure

The above metrics are combined into an overall metric, referred to herein as a fault candidate diagnostic measure, as follows:

$$(C1*\text{match ratio}+C2*(1-\text{mismatch ratio})+C3*\text{excite ratio})/3$$

where C1, C2 and C3 are weighting factors which are real numbers between 0 and 1.

In the illustrated example of FIG. 1, If the weighting factors are set to unity (1), the diagnostic measure for fault candidate f is 66.7%.

It has been found that weighting factors having values of C1=0.4, C2=0.4 and C3=0.2. provide particularly good results. Thus, using these weighting factors in the illustrated example yields a slightly lower diagnostic measure of 66%.

Table 1 shows the metrics as calculated for the example of FIG. 1. If the actual defect is a single stuck-at fault, the overall metric for fault candidate f would be 100%.

TABLE 1

Metrics for Example Fault f

| Metric | Vector 1 | Vector 2 | Vector 3 | Vector 4 | Vector 5 | Cumulative Metric | Sample Size |
|---|---|---|---|---|---|---|---|
| Match Ratio | 3/4 | N/A | 0/2* | 2/2 | N/A | 5/6 = 83% | 2 |
| Mismatch Ratio | 2/5 | N/A | N/A | 0/2 | 3/3 | 5/10 = 50% | 3 |
| Fault Excitation | 1 | N/A | 0 | 1 | N/A | 2/3 = 67% | 3 |

Figure 2:
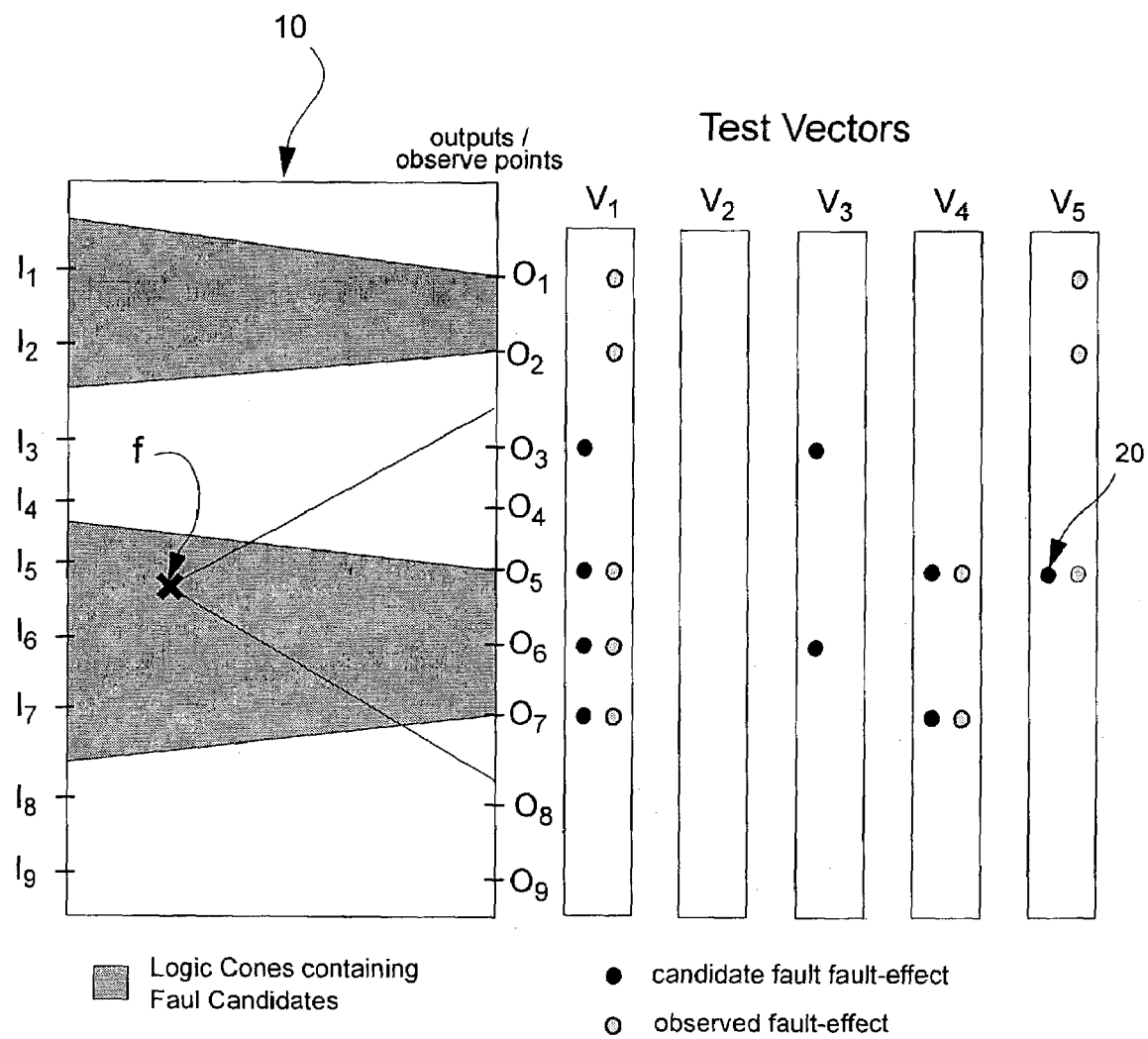
FIG. 2 is similar to FIG. 1, but shows an additional fault candidate fault-effect due to another fault associated with same node.

Diagnostic Measure: [.83 + (1-0.5) + 0.67]/3 = .667 or 66.7%
*0% Match ratios are not counted towards cumulative ratio Some unmodeled defects cause the same node to appear as a SA0 in some vectors and as a SA1 in other vectors. This is the case when two nodes are shorted together or when a gate or an entire path is too slow. It is then desirable to consider a fault candidate to be the combination of SA0 and SA1 faults associated with the same node. Another example of such faults are the STR (slow-to-rise) fault and the STF (slow-to-fall) fault. FIG. 2 shows essentially the same information as FIG. 1 except that the fault candidate considered is the combination of two faults, f and f*, associated with the same circuit node. The fault effect 20 associated with fault f* only occurs at output O5 in vector V5. Fault f* matches one of the observed fault effects. The metrics are re-calculated in Table 2 to show the differences. It will be seen that match and fault excitation ratio have increased slightly and the mismatch ratio has decreased, thus increasing the likelihood that the node associated with faults f and f* are involved in the faulty behavior of the circuit, possibly because of a short with another node in the logic cone driving outputs O1 and O2. The resulting diagnostic measure is 73.7%.

TABLE 2

Metrics for combined Example faults f and f*

| Metric | Vector 1 | Vector 2 | Vector 3 | Vecotor 4 | Vector 5 | Cumulative Metric | Sample Size |
|---|---|---|---|---|---|---|---|
| Match Ratio | 3/4 | N/A | 0/2* | 2/2 | 1/1 | 6/7 = 86% | 3 |

TABLE 2-continued

Metrics for combined Example faults f and f*

| Metric | Vector 1 | Vector 2 | Vector 3 | Vecotor 4 | Vector 5 | Cumulative Metric | Sample Size |
|---|---|---|---|---|---|---|---|
| Mismatch Ratio | 2/5 | N/A | N/A | 0/2 | 2/3 | 4/10 = 40% | 3 |
| Fault Excitation | 1 | N/A | 0 | 1 | 1 | 3/4 = 75% | 4 |

Diagnostic Measure: [.86 + (1-0.4) + 0.75]/3 = .737 or 73.7%
*0% Match ratios are not counted towards cumulative ratio The present invention contemplates the use of a stuck-at fault model for diagnosis. It is assumed that defects that do not correspond literally to a single stuck-at fault will still be diagnosable using the stuck-at fault model. For example, it is assumed that a bridging fault between two gates will result in intermittent stuck-at faults on at least one of the ends of the bridge being selected as the best fault candidate. This, in turn, is believed to be sufficient to point towards the actual defect.

In order to support diagnosis in the presence of more than one fault or in the presence of an un-modeled defect, the present invention does not look for perfect matches, but instead will use above described metrics to order fault candidates and their match likelihood. The order favors the fault candidate which explains the most observed fault effects.

Generating a Fault Candidate List

Methods for determining observed fault effects, fault candidates and fault candidate fault effects are well known in the art and, accordingly, are not described in detail herein. However, to keep performance in check, the present invention contemplates restricting an initial set of fault candidates to faults that can reach the observed fault effect sites. These faults can be identified by the following pre-processing steps:

First, observed fault effects are parsed to identify all observation points on which a fault effect was observed at least once. In the example of FIG. 1, the identified observation points are O1, O2, O5, O6 and O7.

Second, identified observation points or outputs are back-traced towards circuit inputs to identify cones of logic that reach the identified observation points. In the example of FIG. 1, the cones of logic, backtraced from the identified observation points, are shown as hashed areas of the circuit.

Third, all collapsed stuck-at faults which are in the identified cones of logic are placed into a fault candidate List. As is well known in the art, fault collapsing is a known procedure which involves retaining only faults that can be distinguished from others. For example, a 2-input AND gate having six faults (SA0/1 on both inputs and on the output) before collapsing of the fault list would have only four faults after collapsing. Two SA0 faults on the two inputs would be removed because they cannot be distinguished from an SA0 fault on the output. When several gates are connected in a cone of logic, further collapsing may be performed.

Fault Dropping

For some failures, the initial fault candidate list may be very large and require considerable fault simulation effort. In order to keep performance in check, it is preferred to drop faults with the lowest metrics once it becomes sufficiently apparent that such faults are not the probable cause of observed fault-effects. The following heuristics are performed for fault dropping.

Sample Size

For each metric, the number of data samples used to compute the cumulative metric are counted. As soon as one of the metrics reaches a minimum sample size (MSS), the corresponding fault candidate is deemed eligible for fault dropping. Preferably, a software tool provides the ability to set MSS with a command line option to allow for some experimentation. A default value of 15 may be used. For the example of FIG. 1, the sample sizes computed for vectors V1 to V5 are shown in the last column of Table 1.

Dropping Threshold

Once a fault becomes eligible for dropping, it should be dropped from further consideration when its overall metric falls below a dropping threshold DT. Preferably, the software tool provides the ability to set DT to a desired value to allow for some experimentation. A default value of 10% may be employed.

The method of the present invention is performed by a program product in the form of a software diagnostic tool, preferably incorporated into a embedded test access (ETA) server such as is described and claimed in Applicant's U.S. patent application Ser. No. 09/954,078 filed Sep. 13, 2001, for "Method, System and Program Product for Testing and/or Diagnosing Circuit Using Embedded Test Access Data", incorporated herein by reference.

FIG. 4 illustrates a sample gate diagnostic output file which would be generated by the diagnostic tool. The first several lines of the file echo options used to invoke the gate diagnostic tool. The file then contains four sections. Each section provides an ordered or sorted fault candidate list based on the Diagnostic Measure, Match Ratio, Mismatch Ratio, and Excitation Ratio metrics.

The first section, based on the diagnostic measure, typically provides the most useful fault candidate list information. In each section, fault candidates are ranked in order of their likelihood, starting with the most likely. Each fault candidate consists of a full hierarchical design net name and an associated stuck-at fault. For example, in FIG. 4, the most likely defect type and location is a stuck-at-one defect on design net coreInstance.UNITA1_COUNTER.n61. Since the probability is listed as 100%, the defect is definitely located on that net and behaves as a stuck-at-one fault. The example of FIG. 4 does not correspond to that of FIGS. 1 and 2.

Diagnosis is performed by running the diagnosis tool. The tool generates and stores failing flop information into failure log files. FIG. 3 illustrates the content of a failure log file. The failure log file contains the failure data for a specific test run of a set of test vectors. The failure data identifies the vectors for which mis-compares were detected on a tester and the observations points (flops/pins) where the mis-compares occurred for each failing vector. Given the failure log files, the diagnosis tool attempts to identify the failures down to a list of potential failing gates or nodes.

The example failure log file of FIG. 3 is for a logic BIST test on a design called circuitA, to which 32K BIST vectors were applied. For each failing vector, the data starts with "V<n>", where n is a vector number, i.e., the vector is the nth vector in a vector file used for the test (scan), or the nth BIST pattern (BIST). Each subsequent line contains a hexadecimal number referring to a failing observation point for the vector. A number of failure log files may be generated for the same logic test controller to record observed failures under different test conditions. Once failure log files have been collected, the user launches the diagnose tool with the failure log files as input. The tool then analyzes the failures and reports the most probable fault candidates into a diagnostic output file in text format.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of fault diagnosis of an integrated circuit having failing test vectors with observed fault effects using fault candidate fault-effects obtained by simulation of a set of test vectors, comprising:
    determining a fault candidate diagnostic measure for each fault candidate, said fault candidate diagnostic measure having a fault candidate match metric, an observed fault effect mismatch metric and a fault candidate excitation metric;
    ranking fault candidates in decreasing diagnostic measure order; and
    identifying fault candidate(s) having the highest diagnostic measure as the most likely cause of observed fault effects,
    said determining a fault candidate diagnostic measure comprising, for each fault candidate: determining a match metric indicative of fault candidate fault-effects that match observed fault effects; determining a mismatch metric indicative of observed fault effects that do not match fault candidate fault-effects; and determining a fault candidate excitation metric indicative of the number failing vectors that have at least one fault candidate fault effect that matches an observed fault effect and of the number of vectors that have at least one fault candidate fault-effect.

2. A method as defined in claim 1, further including: said determining a match metric including determining a cumulative match metric for said set of test vectors, said cumulative match metric being a ratio of the number of fault candidate fault-effects that match observed faults effects divided by the number of fault candidate fault-effects; and said determining a mismatch metric including determining a cumulative mismatch metric for said set of test vectors, said cumulative mismatch metric being a ratio of the number of observed faults effects that do not match fault candidate fault-effects divided by the number of observed fault effects.

3. A method as defined in claim 1, further including determining a cumulative match metric for said set of test vectors, said cumulative match metric being a ratio of the number of fault candidate fault-effects that match observed faults effects divided by the number of fault candidate fault-effects.

4. A method as defined in claim 3, further including determining a cumulative mismatch metric which is the sum of said number of observed faults effects that do not match fault candidate fault-effects divided by the sum of said number of observed fault effects.

5. A method as defined in claim 4, further including, excluding from said cumulative mismatch metric, numbers associated with vectors which do not have fault candidate faults-effects and observed fault effects.

6. A method as defined in claim 4, further including converting said cumulative mismatch metric to a percentage.

7. A method as defined in claim 4, said determining a fault candidate excitation metric including, for each said vector of said set of vectors, determining whether said vector has at least one observed fault effect and at least one fault candidate fault-effect that matches an observed fault effect.

8. A method as defined in claim 7, said determining a fault candidate excitation metric further including determining a ratio of the number of vectors having at least one fault candidate fault-effect that matches an observed fault effect divided by the number of vectors having at least one fault candidate fault-effect. effects divided by the number of fault candidate fault-effects.

9. A method as defined in claim 1, said determining a match metric comprising, for each vector of said set of test vectors having at least one fault candidate fault effect, determining the number of fault candidate fault-effects and the number of fault candidate fault-effects that match observed faults effects.

10. A method as defined in claim 9, further including determining a cumulative match metric for said set of test vectors, said cumulative match metric being a ratio of said number of fault candidate fault-effects that match observed faults effects divided by the said number of fault candidate fault-effects.

11. A method as defined in claim 10, further including, excluding from said cumulative match metric, vectors which do not have fault candidate fault-effects.

12. A method as defined in claim 10, further including, excluding vectors from said cumulative match metric which do not have fault candidates fault-effects and observed fault effects.

13. A method as defined in claim 10, further including converting said cumulative match metric to a percentage.

14. A method as defined in claim 1 , further including determining a cumulative mismatch metric for said set of vectors, said cumulative mismatch metric being the ratio of the number of observed faults effects that do not match fault candidate fault-effects divided by the number of observed fault effects.

15. A method as defined in claim 1, said determining a mismatch metric comprising, for each vector of said set of test vectors having at least one fault candidate fault effect, determining the number of observed fault-effects and the number of observed faults effects that do not match a fault candidate fault-effect.

16. A method as defined in claim 15, further including determining a cumulative mismatch metric for said set of vectors, said cumulative mismatch metric being a ratio of the number of observed faults effects that do not match fault candidate fault-effects divided by the number of observed fault effects.

17. A method as defined in claim 16, further including, converting said cumulative mismatch metric to a percentage.

18. A method as defined in claim 15, further including, excluding from said set of vectors, vectors which do not have fault candidate fault-effects and observed fault effects.

19. A method as defined in claim 1, said determining a fault candidate excitation metric including, for each vector of said set of test vectors, determining whether said vector includes at least one observed fault effect and at least one fault candidate fault-effect that matches an observed fault effect.

20. A method as defined in claim 19, further including determining a ratio of the number of vectors having at least one fault candidate fault-effect that matches an observed fault effect divided by the total number of vectors having at least one fault candidate fault-effect.

21. A method as defined in claim 1, said simulation of test vectors includes simulation of stuck-at faults.

22. A method as defined in claim 1, further including identifying fault candidates as an individual stuck-at-0 or stuck-at-1 fault associated with a circuit node.

23. A method as defined in claim 1, further including identifying fault candidates as a combination of a stuck-at-0 fault and a stuck-at-1 fault associated with a circuit node.

24. A method as defined in claim 1, further including identifying fault candidates as an individual slow-to-rise or a slow-to-fall fault associated with a circuit node.

25. A method as defined in claim 1, further including identifying fault candidates as a combination of a slow-to-rise fault and a slow-to-fall fault associated with a circuit node.

26. A method as defined in claim 1, said overall metric being a weighted average of said metrics calculated as follows: (C1*match ratio+C2*(1-mismatch ratio)+C3*excitation ratio )/3 where C1, C2 and C3 are a match weighting factor, a mismatch weighting factor and an fault candidate excitation weighting factor, respectively.

27. A method as defined in claim 26, wherein said weighting factors have equal values C1=C2=C3=1.

28. A method as defined in claim 26, wherein said weighting factors are real numbers between 0 and 1.

29. A method as defined in claim 26, wherein said weighting factors have the following values: C1=0.4, C2=0.4 and C3=0.2.

30. A method as defined in claim 1, further including, identifying observed fault effects by applying test vectors to said circuit and comparing circuit output vectors against an expected response; and identifying a fault candidate fault-effects by performing a fault simulation of test vectors.

31. A method as defined in claim 1, further including identifying fault candidates comprising: parsing observed fault effects and identifying all observation points at which a fault effect was observed at least once; backtracing from each identified observation point to identify cones of logic that reach said marked observe points; and placing all collapsed stuck-at faults in identified cones of logic into a fault candidate list.

32. A method as defined in claim 1, further including, prior to said identifying fault candidates, loading a plurality of vectors and comparing test response data with expected values to determine failing vectors.

33. A method as defined in claim 1, further including, for each said metric: counting the data samples used to compute the cumulative metric; and when a metric data sample count reaches a predetermined minimum sample size (MSS), designating a corresponding fault candidate as eligible for dropping.

34. A method as defined in claim 33, further including, when a fault candidate is designated as eligible for dropping, dropping said fault candidate from further consideration when its overall metric falls below a predetermined dropping threshold.

35. A method as defined in claim 34, further including, dropping a fault candidate from further consideration when its overall metric falls below a predetermined dropping threshold.

* * * * *